(12) United States Patent
Schumann et al.

(10) Patent No.: US 8,642,902 B2
(45) Date of Patent: Feb. 4, 2014

(54) SURFACE MOUNTABLE DEVICE

(75) Inventors: Michael Schumann, Neu-Ulm (DE);
Thomas Hoefer, Lappersdorf (DE);
Werner Kuhlmann, München (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 153 days.

(21) Appl. No.: 13/129,238

(22) PCT Filed: Oct. 15, 2009

(86) PCT No.: PCT/DE2009/001435
§ 371 (c)(1),
(2), (4) Date: Jul. 29, 2011

(87) PCT Pub. No.: WO2010/054613
PCT Pub. Date: May 20, 2010

(65) Prior Publication Data
US 2011/0299232 A1 Dec. 8, 2011

(30) Foreign Application Priority Data
Nov. 13, 2008 (DE) .......................... 10 2008 057 174

(51) Int. Cl.
*H01L 23/48* (2006.01)
(52) U.S. Cl.
USPC ............................ 174/527; 257/690; 257/701
(58) Field of Classification Search
USPC ........... 257/680, 690, 701, 784; 174/527, 535
See application file for complete search history.

(56) References Cited

U.S. PATENT DOCUMENTS

| 6,107,679 | A | 8/2000 | Noguchi |
| 6,531,328 | B1 | 3/2003 | Chen |
| 6,661,084 | B1 * | 12/2003 | Peterson et al. ............... 257/680 |
| 6,890,796 | B1 | 5/2005 | Sasaki |
| 2004/0188696 | A1 | 9/2004 | Hsing |
| 2006/0006404 | A1 | 1/2006 | Ibbetson et al. |
| 2008/0179618 | A1 | 7/2008 | Cheng |

FOREIGN PATENT DOCUMENTS

| EP | 1 580 809 | 2/2005 |
| EP | 1 919 000 | 5/2008 |
| GB | 2 098 002 | 11/1992 |
| JP | 2006-066630 | 3/2006 |
| JP | 2006-128512 | 5/2006 |
| JP | 2007-103937 | 4/2007 |
| JP | 2007-208136 | 8/2007 |
| JP | 2007-220925 | 8/2007 |
| JP | 2008-071955 | 3/2008 |
| JP | 2008-258264 | 10/2008 |
| WO | WO 2006/005062 | 1/2006 |

* cited by examiner

*Primary Examiner* — Hung Ngo
(74) *Attorney, Agent, or Firm* — Cozen O'Connor

(57) ABSTRACT

A surface-mountable device (100) is specified, having a mounting side (101), a top side (102) lying opposite the mounting side (101), an electrically insulating carrier plate (1), an electrical component (2) and a housing (3). The carrier plate (1) terminates the device (100) toward the mounting side (101). Furthermore, the carrier plate (1) has a fixing side (103) lying opposite the mounting side (101). For the purpose of making electrical contact with the component (2), the carrier plate (1) has conductor tracks (4) arranged on the fixing side (103), contact areas (5) arranged on the mounting side (101), and openings (6), wherein in each case a contact area (5) is electrically conductively connected to a conductor track (4) by an opening (6). The component (2) is enclosed by the housing (3), wherein at least one opening (6) is arranged below the component (2). The housing (3) and the carrier plate (1) are arranged flush with one another in a plan view of the carrier plate (1). Furthermore, the housing (3) terminates the device (100) toward the top side (102).

15 Claims, 4 Drawing Sheets

Prior Art

SURFACE MOUNTABLE DEVICE

RELATED APPLICATIONS

This application is a U.S. National Phase Application under 35 USC 371 of International Application No. PCT/DE2009/001435 filed on Oct. 15, 2009.

This patent application claims the priority of German patent application 10 2008 057 174.1 filed Nov. 13, 2008, the disclosure content of which is hereby incorporated by reference.

FIELD OF THE INVENTION

The present invention relates to a surface-mountable device comprising a mounting side, a top side lying opposite the mounting side, an electrically insulating carrier plate, an electrical component and a housing.

BACKGROUND OF THE INVENTION

Surface-mountable devices conventionally comprise a carrier plate, an electrical component arranged thereon and a housing, which consists of a molding compound, for example. Hitherto, the contact-connection of the electrical component has usually been effected by means of a bonding wire led from a top side of the component to the carrier plate, and by a conductive adhesive at an underside of the component. In this case, the base area of the housing is usually smaller than the base area of the carrier plate. The carrier plate thus projects beyond the housing at two opposite sides in order, in regions of the projecting carrier plate, to lead electrical guides, for example conductor tracks, onto a mounting side of the carrier plate, which is arranged in a manner lying opposite the housing. However, a device embodied in this way with a carrier plate projecting beyond the housing disadvantageously leads to an increased space consumption.

SUMMARY OF THE INVENTION

One object of the invention is to provide a surface-mountable device which is particularly space-saving, in particular has a small device size and a small lateral extent.

This and other objects are attained in accordance with one aspect of the invention directed to a surface-mountable device, comprising a mounting side, a top side lying opposite the mounting side, an electrically insulating carrier plate, an electrical component and a housing. The carrier plate terminates the device toward the mounting side and has a fixing side lying opposite the mounting side, conductor tracks being arranged on said fixing side for the purpose of making electrical contact with the component. Contact areas are arranged on the mounting side of the carrier plate. Furthermore, the carrier plate has openings, wherein in each case a contact area is electrically conductively connected to a conductor track by means of an opening. The component is arranged on the fixing side of the carrier plate and is enclosed by the housing. At least one opening in the carrier plate is arranged below the component. The housing is arranged on the fixing side of the carrier plate and terminates the device toward the top side. The housing and the carrier plate are arranged flush with one another in a plan view of the carrier plate.

Electrical guides, for example conductor tracks, from the fixing side of the carrier plate to the mounting side of the carrier plate are thus led via openings, so-called microvias. The latter are preferably arranged below the component. As a result, projecting carrier plate regions which serve for leading the conductor tracks onto the mounting side of the carrier plate are advantageously not necessary. The device size, in particular the lateral extent of the device and the base area of the device, can thus advantageously be reduced. This is advantageous in particular for devices which comprise comparatively large components, and/or for devices which have a certain complexity, in particular a plurality of external electrical connection locations.

The device can preferably be arranged with the mounting side on a printed circuit board, wherein the contact areas of the device are preferably electrically conductively connected to connection locations of the printed circuit board, for example by means of a conductive adhesive. Consequently, the electrical contact-connection of the electrical component of the device leads from the connection locations of the printed circuit board via the contact areas and the openings of the carrier plate to the conductor tracks on the fixing side of the carrier plate.

In one preferred configuration of the surface-mountable device, the openings of the carrier plate are arranged exclusively below the component.

This advantageously further decreases the device size, in particular the lateral extent of the device. A space-saving surface-mountable device is advantageously possible.

In a further preferred configuration of the surface-mountable device, the housing completely electrically insulates the component and the conductor tracks toward the outside.

External electrical guides, for example electrical guides of adjacent electrical components, can thus advantageously be arranged on the housing or at side areas of the housing without in this case producing a short circuit of the device, in particular of the electrical component of the device. Space-saving arrangements comprising a plurality of electrical devices or components are thus advantageously possible.

The housing is preferably composed of a material that is electrically insulating. Particularly preferably, the housing comprises a molding compound.

In a further preferred configuration of the device, the device is electrically conductively contact-connectable toward the outside exclusively via the mounting side.

In particular, the device is preferably electrically conductively contact-connectable exclusively by means of the openings.

By virtue of the fact that the device is electrically conductively contact-connectable exclusively via the mounting side by means of the openings, and the top side of the device, in particular the housing of the device, is embodied as electrically insulating, the risk of a short circuit of the device, in particular of the electrical component, can advantageously be minimized.

Particularly preferably, the device has side areas, wherein the side areas and the top side of the device are embodied as completely electrically insulating toward the outside.

In particular, the device has no electrical guides, in particular conductor tracks and/or bonding wires, which reach as far as the side areas of the device and are electrically contact-connectable toward the outside there. The side areas and/or the top side of the device thus advantageously afford the possibility of being available for, for example, external electrical guides of, for example, adjacent electrical components. Arrangements of external electrical components near the device are thus advantageously made possible, as a result of which space-saving arrangements of multiple electrical components or devices can be realized.

In one preferred configuration, an electrically insulating separating layer is arranged between the component and the carrier plate.

In particular, conductor tracks arranged on the fixing side of the carrier plate are preferably covered wholly or partly with the electrically insulating separating layer. This results in an electrical insulation between the component and the conductor tracks in the region where the component is fixed.

Preferably, the electrical component is electrically conductively connected to the conductor tracks, in particular by means of bonding wires, at a top side remote from the carrier plate. In particular, a respective bonding wire leads from the top side of the component to a respective conductor track of the carrier plate. In this case, the electrical contact-connection of the component is therefore effected only from the top side of the component. Other single-sided electrical contact-connections of an electrical component and electrical guides connected thereto in the electrical component, such as flip-chip components, for example, are known to the person skilled in the art and will therefore not be explained in any greater detail at this juncture.

In a further configuration of the surface-mountable device, the component is arranged on an opening of the carrier plate and is electrically conductively connected to a contact area through the opening.

A two-sided contact-connection of the electrical component is possible in this case. One electrical contact-connection is led at an underside of the component via the opening to the contact area. By contrast, the second electrical contact-connection of the component can be led from the top side of the component by means of a bonding wire to a respective conductor track.

If an electrically insulating separating layer is arranged between the component and the carrier plate in this case, then there is arranged in the separating layer an opening which, in particular, contains an electrically conductive material and electrically conductively connects the underside of the component to the opening of the carrier plate, and thus the contact area.

Preferably, the component is fixed by means of an adhesive, a conductive adhesive or an electrically conductive solder.

In one preferred configuration of the device, the component has an active layer suitable for generating or for detecting electromagnetic radiation.

The active layer of the component preferably has at least one pn junction, a double heterostructure, a single quantum well structure (SQW, single quantum well) or a multiquantum well structure (MQW, multiquantum well) for generating radiation. In this case, the designation quantum well structure does not exhibit any significance with regard to the dimensionality of the quantization. It therefore encompasses, inter alia, quantum wells, quantum wires and quantum dots and any combination of these structures.

Particularly preferably, the component has a radiation exit side lying opposite the carrier plate, through which radiation exit side radiation generated in the component can leave the component. Preferably, the top side of the component is the radiation exit side.

The component is preferably a semiconductor body, particularly preferably a thin-film semiconductor body. In the context of the application, a thin-film semiconductor body is considered to be a semiconductor body during whose production the growth substrate, onto which a semiconductor layer sequence comprising a semiconductor body of the thin-film semiconductor body was grown epitaxially, for example, has been stripped away.

The layers of the semiconductor body are preferably based on a III/V compound semiconductor material. A III/V compound semiconductor material comprises at least one element from the third main group such as, for example, Al, Ga, In and one element from the fifth main group such as, for example, N, P, As. In particular, the term III/V compound semiconductor material encompasses the group of binary, ternary and quaternary compounds containing at least one element from the third main group and at least one element from the fifth main group, in particular nitride and phosphide compound semiconductors. Moreover, such a binary, ternary or quaternary compound can comprise, for example, one or more dopants and additional constituents.

Particularly preferably, the component is an LED, an IRED, a phototransistor, a photodiode or an opto-IC.

If the component is substantially provided for detecting radiation, and is embodied for example as a photodiode, phototransistor or opto-IC, then the layers of the component preferably contain silicon.

Preferably, the housing is transparent to the radiation emitted or to be detected by the component. The radiation generated or to be detected by the component can thus be coupled out through the housing. In particular, the housing has a low absorption coefficient for the radiation emitted or to be detected by the component.

Alternatively, the housing can be radiation-opaque to radiation in a wavelength range. In this case, the housing serves for wavelength selection. Radiation in a specific, in particular undesired, wavelength range can thus be filtered out selectively from the wavelength range of the radiation emitted or to be detected by the component. The housing thus serves as a filter for specific wavelengths.

In one preferred configuration of the device, a plurality of electrical components are arranged on the fixing side of the carrier plate, said components in each case being enclosed by the housing.

A plurality of devices can thus advantageously be produced during a production method. Mass production of surface-mountable devices is advantageously made possible.

In particular, a plurality of devices are thus produced, which are subsequently separated from one another by means of singulation, for example by sawing in two directions. In this case, all four side areas of the device are produced by sawing. Alternatively, sawing can be effected only in one direction for singulation purposes, such that only two side areas of the device are produced by sawing.

In particular, carrier plates having only one layer and carrier plates having a multilayered construction are conceivable for the device. In one preferred configuration of the device, the carrier plate has a multilayered construction. By virtue of a multilayered construction, properties of the carrier plate can be adapted to desired requirements. By way of example, a multilayered carrier plate is distinguished by an improved resistance to creapage current, improved radiofrequency properties or low water absorption.

Preferably, the carrier plate contains a base material, for example a ceramic or epoxy resin, and a glass fiber fabric contained therein. In particular, the carrier plate is preferably electrically insulating.

In one preferred configuration, the openings of the carrier plate each comprise an electrically conductive material. In this case, the openings can be partly or completely filled with the electrically conductive material. The electrically conductive material is a metal or a metal alloy, for example.

Preferably, the openings of the carrier plate contain an electrically conductive solid body that is preferably inserted into the openings. Preferably, the solid body is in this case adapted to the size of the opening in such a way that it completely fills the latter after insertion. By way of example, the solid body can contain copper or consist of copper.

As a further variant it is conceivable for the openings to be filled with an electrically insulating material and/or to be covered with an electrically insulating material. In particular, the openings can be covered by means of the electrically insulating separating layer arranged between component and carrier plate.

The openings of the carrier plate can accordingly be designed in an application-specific fashion. In particular, the openings can contain, depending on the field of application, an electrically conductive filling compound, an electrically insulating filling compound and/or air.

DETAILED DESCRIPTION OF THE DRAWINGS

Identical or identically acting constituent parts are in each case provided with the same reference symbols. The constituent parts illustrated and also the size relationships of the constituent parts among one another should not be regarded as true to scale.

Figure 5A:
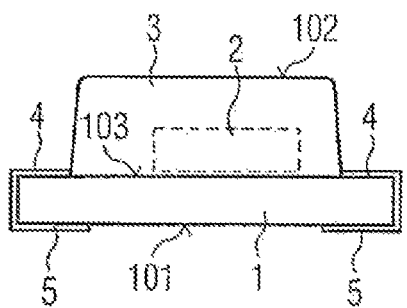
Figure 5B:
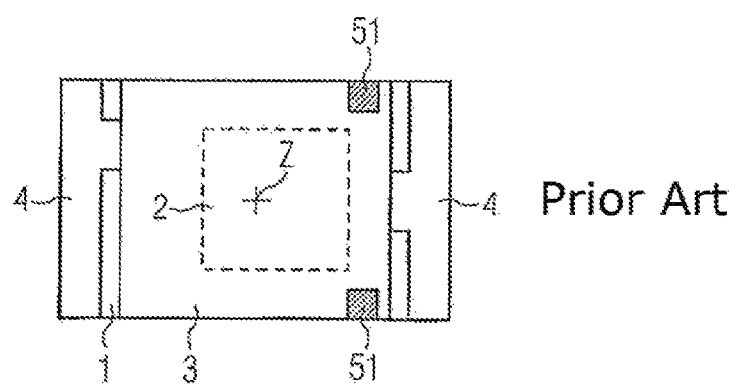

FIGS. 5A and 5B in each case illustrate a conventional surface-mountable device. In particular, FIG. 5A illustrates a cross section of a conventional device and FIG. 5B illustrates a plan view of the device of the exemplary embodiment in FIG. 5A. The device comprises a mounting side 101, a top side 102 lying opposite the mounting side 101, a carrier plate 1, an electrical component 2 and a housing 3.

The electrical component 2 is arranged, in particular, on the carrier plate 1 and is electrically conductively connected by means of conductor tracks 4. In this case, the conductor tracks 4 are led via side areas of the carrier plate 1 onto the mounting side 101 of the device. In particular, the carrier plate 1 has no openings for making electrical contact with the electrical component 2.

The electrical component 2 is completely enclosed by a housing 3, wherein the housing 3, for the purpose of making electrical contact with the electrical component 2, does not completely cover a fixing side 103 of the carrier plate 1. In particular, the carrier plate 1 has regions on which no housing 3 is arranged. The base area of the housing 3 is accordingly smaller than the base area of the carrier plate 1.

The carrier plate 1 therefore projects beyond the housing 3 at two opposite sides. By means of the projecting regions of the carrier plate 1, the fixing side 103 and the mounting side 101 of the carrier plate 1 are electrically conductively connected to one another, and in particular the conductor tracks 4 are guided.

With the mounting side 101, the device can be arranged on a printed circuit board (not illustrated), wherein, for the purpose of making electrical contact with the electrical component 2, the conductor tracks of the carrier plate 1 are electrically conductively connected to connection locations of the printed circuit board.

A large space requirement of the device is disadvantageously necessary by virtue of the projecting regions of the carrier plate 1. In particular, the base area of a conventional device, by virtue of the projecting regions of the carrier plate 1, has a much larger base area than a device according to the invention such as is illustrated, for example, in the exemplary embodiment in FIG. 1.

Figure 1:
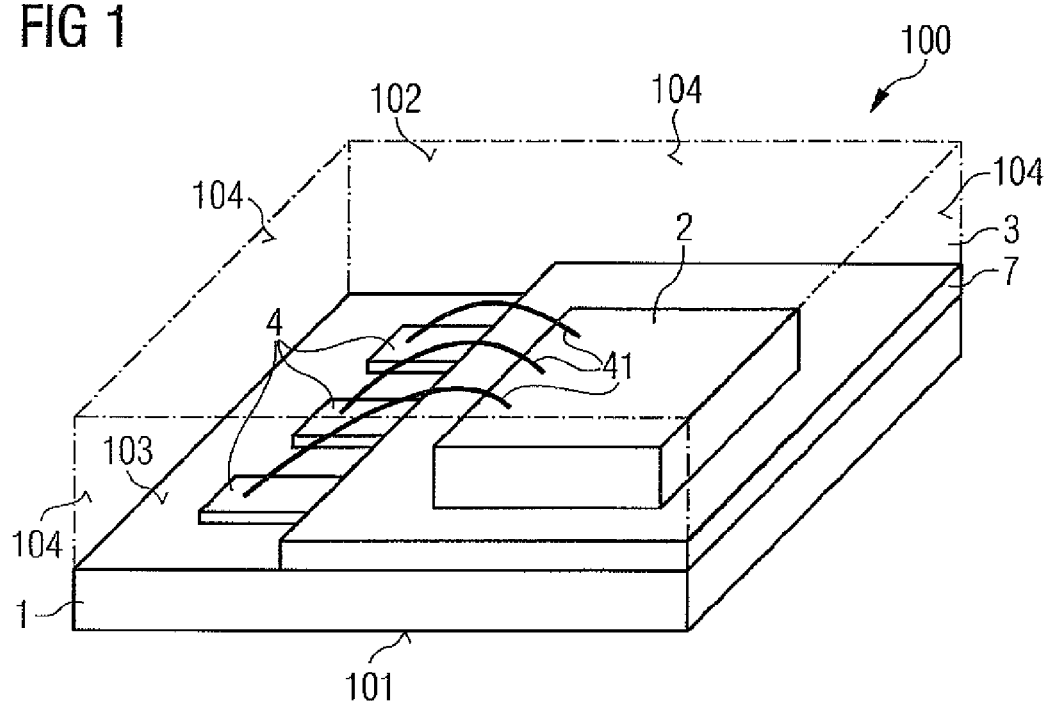
FIG. 1 shows a schematic view of an exemplary embodiment of a device according to the invention, FIGS. 2A to 2C in each case show a schematic view of a device according to an embodiment of the invention in different production stages, FIGS. 3A to 3C in each case show a longitudinal section of a further exemplary embodiment of a device according to the invention.

FIG. 1 shows a surface-mountable device 100 comprising a carrier plate 1, an electrical component 2 and a housing 3.

The electrical component 2 is preferably a radiation-emitting or radiation-detecting component. Preferably, the component is an LED, an IRED, a phototransistor, a photodiode or an opto-IC.

The electrical component 2 preferably has an active layer suitable for generating or for detecting electromagnetic radiation. The component 2 is preferably embodied in thin-film design. In particular, the component 2 preferably comprises epitaxially deposited layers that form the component 2. The layers of the component 2 are preferably based on a III/V compound semiconductor material.

The component 2 preferably has a radiation exit side, at which the radiation generated in the active layer emerges from the component 2. The radiation-exit side of the component is preferably arranged at the side lying opposite the carrier plate.

In particular, the component 2 is arranged on a fixing side 103 of the carrier plate 1 and is completely enclosed by the housing 3.

The surface-mountable device 100 has a mounting side 101 and a top side 102. The carrier plate 1 terminates the device 100 toward the mounting side 101. The fixing side 103 of the carrier plate 1 is arranged in a manner lying opposite the mounting side 101.

For the purpose of making electrical contact with the component 2, conductor tracks 4 are arranged on the fixing side 103 of the carrier plate 1. Furthermore, contact areas are arranged on the mounting side 101 (not illustrated). The carrier plate 1 furthermore has openings, wherein in each case a contact area is electrically conductively connected to a conductor track 4 by means of an opening. In the exemplary embodiment in FIG. 1, in particular three openings are arranged below the component 2 (not illustrated).

The housing 3 is arranged on the fixing side 103 of the carrier plate 1. The housing 3 terminates the device 100 toward the top side 102. Furthermore, the housing 3 and the carrier plate 1 are arranged flush with one another in a plan view of the carrier plate 1.

With the mounting side 101, the device 100 can be arranged on a printed circuit board (not illustrated). In particular, for the purpose of making electrical contact with the component 2, the contact areas of the carrier plate 1 can be electrically conductively connected to connection locations of the printed circuit board.

By virtue of the fact that the openings are arranged at least partly below the component 2, a space-saving device can be obtained. In particular, no projecting carrier plate regions, as is conventionally the case, are necessary in order to enable an electrical contact routing to the mounting side 101 of the device 100. A surface-mountable device 100 having a small device size, in particular a small lateral extent, is thus advantageously made possible.

The housing 3 is preferably transparent to the radiation emitted or to be detected by the component 2. Alternatively, the housing 3 can be radiation-opaque to radiation in a desired wavelength range. In this case, the housing 3 fulfils a filter function for predefined wavelength ranges.

An electrically insulating separating layer 7 is arranged between the carrier plate 1 and the component 2. The electrically insulating separating layer 7 completely covers the openings arranged in the carrier plate 1. Furthermore, the separating layer 7 insulates the component 2 and the carrier plate 1 from one another. The separating layer 7 is arranged in regions on the conductor tracks 4 of the carrier plate 1. Those regions of the conductor tracks 4 which are not covered by the separating layer 7 are in each case electrically conductively connected to a top side of the component 2 by means of a bonding wire 41.

In the exemplary embodiment in FIG. 1, the electrical component 2 is therefore electrically conductively contact-connected only at the top side. By contrast, the underside of the component 2 is electrically insulated from the conductor tracks 4 by the separating layer 7.

The housing 3 preferably comprises an electrically insulating material. Preferably, the housing 3 completely insulates the component 2, the conductor tracks 4 and the bonding wires 41 toward the outside. In particular, the device 100 is electrically conductively contact-connectable toward the outside exclusively via the mounting side 101. In particular, the device 100 is electrically conductively contact-connectable exclusively by means of the openings arranged in the carrier plate 1.

The device 100 preferably has side areas 104, wherein the side areas 104 and the top side 102 are embodied as completely electrically insulating toward the outside. In particular, no electrical connections, in particular conductor tracks 4 and/or bonding wires, are led from the component 2 to one of the side areas 104. As a result, it is possible that further electrical components 2 or devices 100 can be arranged at the housing 3 of the device 100, in particular alongside or on the device 100, without producing a short circuit in this case. Thus, a plurality of devices 100 and/or electrical components 2 can be arranged alongside one another in a space-saving manner, without the electrical guides of the devices 100 and/or components 2 overlapping.

In the exemplary embodiment in FIG. 1, the electrical component 2 is electrically conductively connected to a respective conductor track 4 via three bonding wires 41. Alternatively, the component 2 can also be electrically conductively connected from the underside via an opening of the carrier plate 1. For this purpose, at least one opening containing an electrically conductive material, for example a metal or a metal alloy, is provided in the separating layer 7. As a result, at least one opening of the carrier plate 1 can be electrically conductively connected to the underside of the component 2 by means of the opening in the separating layer 7.

Figure 2A:
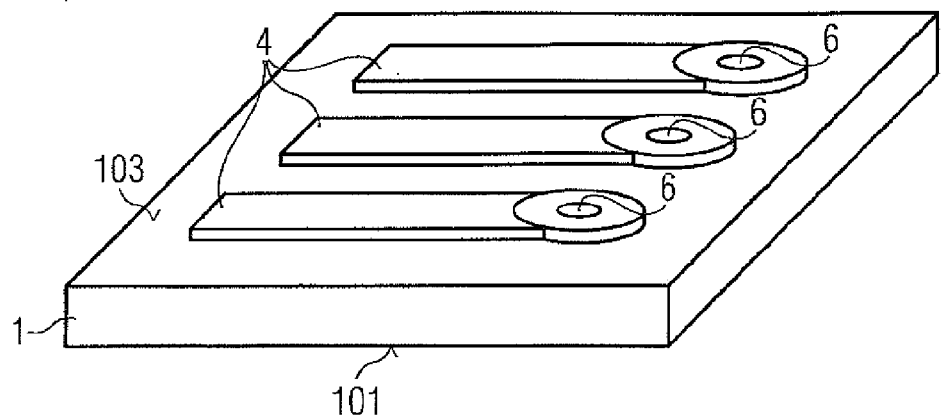
Figure 2B:
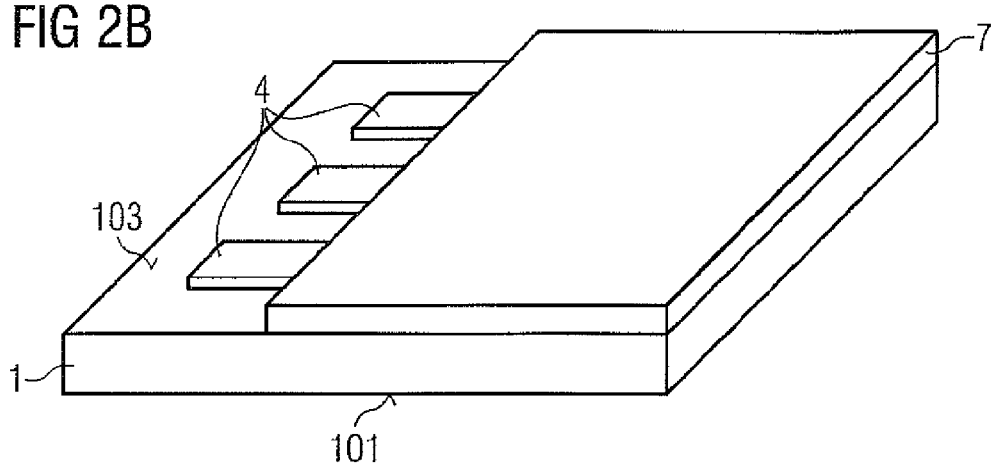
Figure 2C:
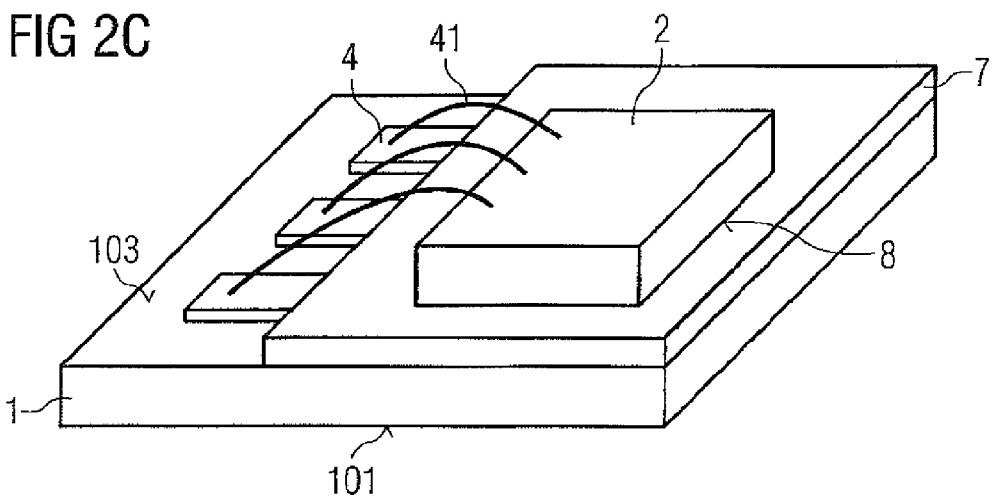

FIGS. 2A to 2C in each case illustrate a schematic view of a device according to the invention in different production stages. FIG. 2A shows the carrier plate 1 in a plan view.

The carrier plate 1 has a mounting side 101 and a fixing side 103. Conductor tracks 4 are formed on the fixing side 103. Furthermore, openings 6 are formed in the carrier plate 1. The openings 6 are filled with an electrically conductive material, for example a metal or a metal alloy. Furthermore, the openings 6 are in each case arranged below an end region of a respective conductor track 4. The electrically conductive material arranged within the openings 6 can thus be directly electrically conductively connected in each case to an end region of the conductor tracks 4.

Contact areas are arranged on the mounting side 101 of the carrier plate 1 (not illustrated). The contact areas are in each case electrically conductively connected to a respective conductor track 4 via the openings 6. In particular, the electrically conductive material respectively in the openings 6 is electrically conductively connected to a conductor track 4 and to a contact area, such that in each case a conductor track 4 of the fixing side 103 is electrically conductively connected to a contact area of the mounting side 101.

FIG. 2B exhibits a next method step in the production of a surface-mountable device. An electrically insulating separating layer 7 is arranged on partial regions of the carrier plate 1. In particular, the openings of the carrier plate 1 at the fixing side 103 are covered by means of the separating layer 7.

The conductor tracks 4 of the carrier plate 1 are partly covered by the separating layer 7. A surface-mountable device produced in this method stage can accordingly be classified into two partial regions. In particular, the device has one partial region embodied in electrically insulating fashion by means of the separating layer 7 at the fixing side 103 of the carrier plate 1. Furthermore, the device has a second partial region, in which the fixing side 103 has conductor tracks 4 not provided with an electrically insulating separating layer 7. In this partial region, therefore, the device can be electrically conductively contact-connected via the conductor tracks 4, the openings and the contact areas.

In the device illustrated in FIG. 2C, an electrical component 2 is applied to the electrically insulating separating layer 7. Preferably, the electrical component 2 is fixed by means of an adhesive 8 or a solder on the separating layer 7.

The electrical component 2, in the same way as in the exemplary embodiment illustrated in FIG. 1, is preferably a radiation-emitting or detecting component. In particular, the component is preferably an LED, an IRED, a phototransistor, a photodiode or an opto-IC.

For the purpose of making electrical contact with the component 2, a bonding wire 41 is led in each case from a conductor track 4 to a contact location at a top side of the component 2 lying opposite the carrier plate 1.

Alternatively, the electrical component 2 can be arranged directly on a conductor track 4 of the carrier plate 1, in particular on an opening of the carrier plate 1 (not illustrated). In this case, preferably no electrically insulating separating layer 7 is arranged between the component 2 and the carrier plate 1. A further electrical contact of the component and any further electrical contact can preferably be led via the top side of the component by means of bonding wires to further conductor tracks 4 that are in each case electrically insulated from the first conductor track 4.

In a next method step, a housing is arranged on the fixing side 103 of the carrier plate 1 (not illustrated). In particular, the housing is arranged in such a way that the electrical component 2, the bonding wires 41 and the conductor tracks 4 are completely enclosed by the housing material. The top side and the side areas of the device are thus embodied as completely electrically insulating. An electrical contact-connection of the device is accordingly possible only via the mounting side 101.

In particular, the housing seals the component 2 and the bonding wires 41 (not illustrated). The housing is preferably applied by means of a transfer molding process. The housing preferably comprises a molding compound that is transparent to radiation or has a filter effect for specific wavelength ranges. Once the housing has been applied, a device such as shown in the exemplary embodiment of FIG. 1, for example, has been produced.

Figure 3A:
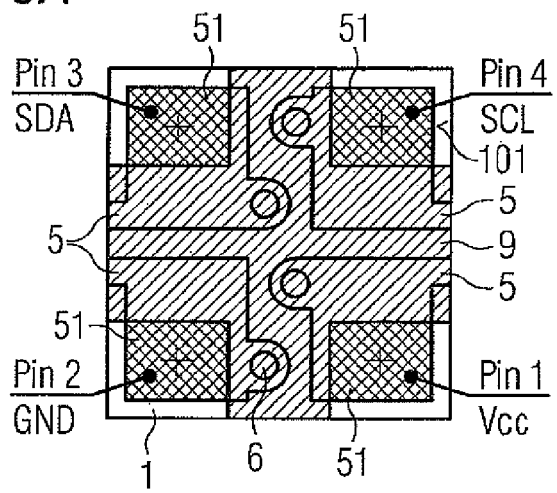
Figure 3B:
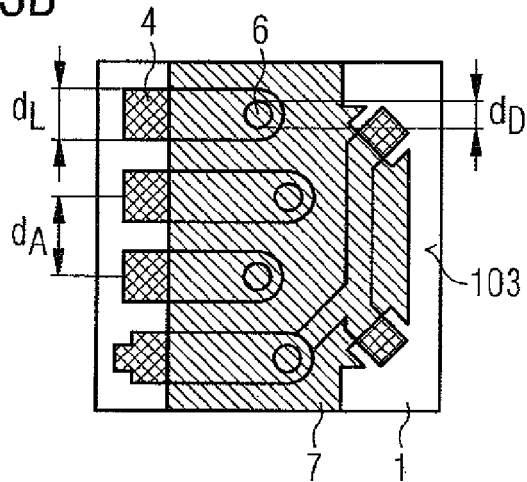
Figure 3C:
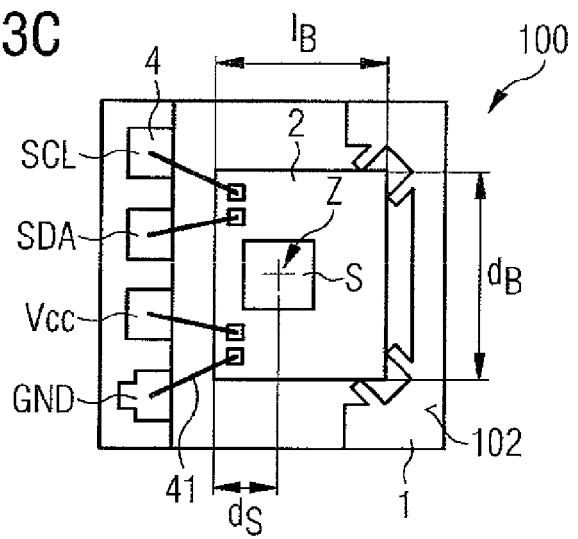

FIGS. 3A to 3C in each case show a plan view of a further exemplary embodiment of a device according to the invention. In particular, FIG. 3A illustrates a plan view of a mounting side 101 of the device. FIG. 3B shows a plan view of a fixing side 103 of the carrier plate 1. FIG. 3C schematically illustrates a schematic plan view of a top side 102 of a surface-mountable device 100.

Contact areas 5 are arranged at the mounting side 101 of the carrier plate 1. Four contact areas 5 electrically insulated from one another by a distance are arranged in the exemplary embodiment in FIG. 3A. The contact areas 5 at least partly overlap openings 6 integrated in the carrier plate 1. A contact area 5 is respectively arranged below an opening 6. The openings 6 are preferably filled with an electrically conductive material, for example a metal or a metal alloy. Thus, the contact areas 5 arranged at the underside of the carrier plate 1 can be electrically conductively connected to conductor tracks at the fixing side of the carrier plate 1.

The contact areas 5 and the distances between the contact areas 5 are preferably partly planarized with an electrically insulating material 9. In particular, the regions between the contact areas 5 are completely filled with an electrically insulating material 9. The contact areas 5 are provided with the electrically insulating material 9 preferably only in part, in particular in regions of the openings 6. Partial regions of the contact areas 5 preferably have no electrically insulating material 9, such that external electrical connection locations 51 are produced in the partial regions. Four electrical connection locations 51 insulated from one another are arranged in the exemplary embodiment in FIG. 3A.

The connection locations 51 are in each case preferably provided for an electrical contact-connection. By way of example, one electrical connection location 51 is provided as a ground connection (GND). A further electrical connection location can be provided, for example, as a connection location for a supply voltage (voltage of the common collector: VCC). A further connection location is provided for example for an SCL (single computer logic). The last connection location in the exemplary embodiment in FIG. 3A can be employed, for example, as a connection location for an SDA (smart digital assistant).

The contact areas 51 preferably have a length in a range of between 0.5 mm and 0.7 mm, in particular 0.6 mm. The width of the contact areas 51 is in each case approximately in a range of between 0.4 mm and 0.5 mm, and is, in particular, preferably 0.45 mm.

The contact areas 51 each have a mid point, identified by a cross in FIG. 3A. The mid points of two contact areas 51 are arranged for example at a distance from one another of between 1.1 mm and 1.4 mm.

FIG. 3B shows a plan view of a fixing side 103 of a carrier plate 1. An electrical component and a housing are not illustrated in the exemplary embodiment of FIG. 3B, for the sake of clarity.

Conductor tracks 4 are arranged on the fixing side 103 of the carrier plate 1. Preferably, the conductor tracks 4 have a width $d_L$ in a range of between 0.2 mm and 0.4 mm and a distance from one another $d_A$ in a range of between 0.4 mm and 0.5 mm. By way of example, the conductor tracks 4 have a width $d_L$ of 0.3 mm and a distance from one another $d_A$ of 0.467 mm.

In each case an opening 6 of the carrier plate 1 is arranged below a partial region of the conductor tracks 4. The conductor tracks 4 preferably completely enclose the opening 6. An electrically conductive material arranged in the opening 6 can thus be electrically conductively connected to a respective conductor track 4. The openings 6 each have a diameter $d_D$ of approximately 0.15 mm, for example.

An electrically insulating separating layer 7 is arranged on at least one partial region of the fixing side 103 of the carrier plate 1. In particular, the openings 6 of the carrier plate 1 and a partial region of the conductor tracks 4 are covered by the electrically insulating separating layer 7. By contrast, further partial regions of the conductor tracks 4 have no electrically insulating separating layer 7. In these further partial regions, an electrical component can be electrically conductively connected to the conductor tracks 4 by means of bonding wires, for example.

FIG. 3C illustrates a plan view of a surface-mountable device. In comparison with the exemplary embodiment in FIG. 3B, an electrical component 2, in particular an LED, an IRED, a phototransistor, a photodiode or an opto-IC, is arranged on the electrically insulating layer 7. The electrical component 2 has, for example, a width $d_B$ of approximately 1.2 mm and a length $l_B$ of approximately 1 mm. Furthermore, the electrical component 2 preferably has a radiation-emitting region S having a central region Z. The central region Z is arranged at a distance of approximately 0.35 mm, for example from a side area of the electrical component 2. The radiation-emitting region S has an area of approximately 0.16 mm², for example.

Contact locations of the electrical component 2 are preferably electrically conductively connected to a conductor track 4 in each case by means of a bonding wire 41. In particular, the bonding wires 41 are in each case electrically conductively connected to a partial region of the carrier plate 4 on which no electrically insulating separating layer 7 is arranged.

The electrical component 2 is preferably arranged on the electrically insulating layer 7. As a result, the conductor tracks 4 are electrically insulated from the electrical component 2 in a fixing region of the component 2. A short circuit of the component 2 can thus be avoided.

The device has, for example, a base area of approximately 2+/−0.15 mm².

Figure 4:
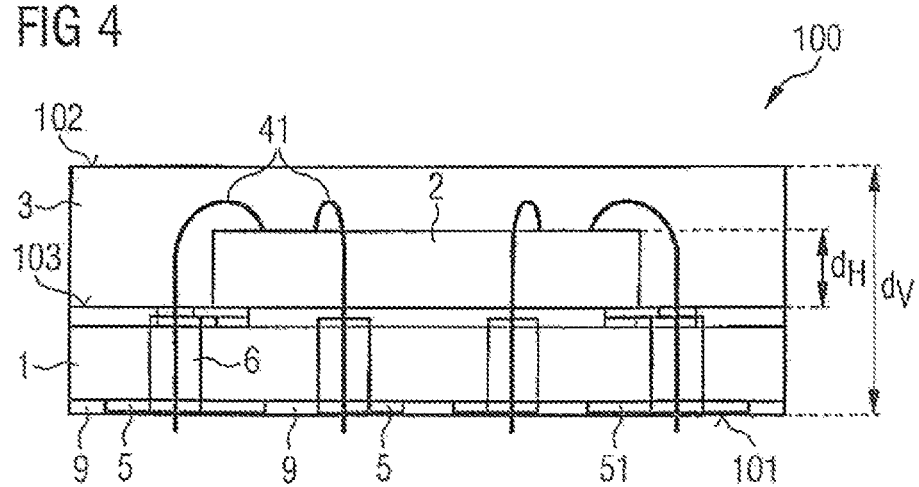
FIG. 4 shows a schematic cross section of a further exemplary embodiment of a device according to the invention, and FIGS. 5A, 5B in each case show a view of an exemplary embodiment of a conventional surface-mountable device.

FIG. 4 illustrates a cross section of a surface-mountable device 100, for example of a device 100 of the exemplary embodiment from FIG. 1. An electrically insulating separating layer 7 is arranged on a fixing side 103 of a carrier plate 1 and an electrical component 2 is arranged on said layer. The carrier plate 1 has openings 6 through which electrical guides, in particular electrically conductive material, lead to contact areas 5 arranged on a mounting side 101 of the device. The electrical component 2 can thus be externally electrically contact-connected by means of the openings 6 at the mounting side 101 of the device 100. In particular, the device 100 is electrically conduct-connectable only from the mounting side 101.

The electrical component 2 has a height $d_E$ of approximately 0.22 mm, for example. The device 100 has a height $d_v$ of approximately 0.7+/−0.1 mm, for example.

A housing 3 is molded around the electrical component 2, in particular encloses the latter, completely. Furthermore, the bonding wires 41 are completely enclosed by the housing 3. The housing 3 is arranged, in particular, flush with the carrier plate 1. In particular, the side areas of the housing 3 merge linearly into the side areas of the carrier plate 1.

Contact areas 5, in particular external connection locations 51, and an electrically insulating material 9 are arranged on the mounting side 101 of the device 100. By means of the electrically insulating material 9, the device 100 can advantageously be planarized toward the mounting side 101. Furthermore, short circuits of the device 100 and/or of the electrical component 2 can thus advantageously be avoided. The device can be electrically contact-connected toward the outside by means of the connection locations 51.

The explanation of the device according to the invention on the basis of the exemplary embodiments described above should not be regarded as a restriction of the invention thereto. Rather, the invention encompasses any novel feature and also any combination of features, which in particular includes any combination of features in the patent claims, even if this feature or this combination itself is not explicitly specified in the patent claims or the exemplary embodiments.

The invention claimed is:

1. A surface-mountable device comprising:
    a mounting side;
    a top side lying opposite the mounting side;
    an electrically insulating carrier plate;
    an electrical component; and
    a housing;
    wherein the electrically insulating carrier plate:
        terminates the surface-mountable device toward the mounting side;
        has a fixing side lying opposite the mounting side;
        has conductor tracks arranged on the fixing side for making electrical contact with the electrical component;
        has contact areas arranged on the mounting side; and
        has openings;
    wherein a respective contact area of the contact areas is electrically conductively connected to a respective conductor track of the conductor tracks via a respective opening of said openings;
    wherein the electrical component is arranged on the fixing side of the electrically insulating carrier plate and is enclosed by the housing;
    wherein at least one opening of said openings is arranged below the electrical component;
    wherein the housing is arranged on the fixing side of the electrically insulating carrier plate, such that the housing and the electrically insulating carrier plate are arranged flush with one another in a plan view of the electrically insulating carrier plate, and the housing terminates the surface-mountable device toward the top side;
    wherein an electrically insulating separating layer is arranged between the electrical component and the electrically insulating carrier plate; and
    wherein at least one further opening is arranged in the electrically insulating separating layer and contains an electrically conductive material, such that one of the openings of the electrically insulating carrier plate is electrically conductively connected to the electrical component via the at least one further opening in the electrically insulating separating layer.

2. The surface-mountable device according to claim 1, wherein the openings of the electrically insulating carrier plate are arranged exclusively below the electrical component.

3. The surface-mountable device according to claim 1, wherein the housing completely electrically insulates the electrical component and the conductor tracks toward the outside.

4. The surface-mountable device according to claim 1, wherein the surface-mountable device is electrically conductively contact-connectable toward the outside exclusively via the mounting side.

5. The surface-mountable device according to claim 1, wherein the surface-mountable device is electrically conductively contact-connectable exclusively via the openings of the electrically insulating carrier plate.

6. The surface-mountable device according to claim 1, wherein the surface-mountable device has side areas, and the side areas and the top side are embodied as completely electrically insulating toward the outside.

7. The surface-mountable device according to claim 1, wherein the electrical component is arranged on an opening of the electrically insulating carrier plate and is electrically conductively connected to a contact area through the opening.

8. The surface-mountable device according to claim 1, wherein the electrical component is fixed by an adhesive.

9. The surface-mountable device according to claim 1, wherein the electrical component has an active layer configured to one of generate and detect electromagnetic radiation.

10. The surface-mountable device according to claim 9, wherein the housing is transparent to the radiation emitted or to be detected by the electrical component.

11. The surface-mountable device according to claim 9, wherein the housing is radiation-opaque to radiation in a wavelength range.

12. The surface-mountable device according to claim 1, wherein the electrical component is an LED, an IRED, a phototransistor, a photodiode or an opto-IC.

13. The surface-mountable device according to claim 1, wherein a plurality of electrical components are arranged on the fixing side of the electrically insulating carrier plate, each of said plurality of electrical components being enclosed by the housing.

14. The surface-mountable device according to claim 1, wherein the electrically insulating carrier plate has a multi-layered construction.

15. The surface-mountable device according to claim 1, wherein the electrical component has an active layer configured to one of generate and detect electromagnetic radiation; and wherein the electrical component has an active layer which is configured to one of generate and detect the electromagnetic radiation, and the housing is formed as a filter for a predefined wavelength range of the generated or to be detected electromagnetic radiation.

* * * * *